(12) United States Patent
Wilson

(10) Patent No.: US 11,787,311 B2
(45) Date of Patent: *Oct. 17, 2023

(54) APPARATUS AND METHOD OF PRODUCING A SENSING SUBSTRATE

(71) Applicant: Joyson Safety Systems Acquisition LLC, Auburn Hills, MI (US)

(72) Inventor: David Wilson, Clarkston, MI (US)

(73) Assignee: Joyson Safety Systems Acquisition LLC, Auburn Hills, MI (US)

(*) Notice: Subject to any disclaimer, the term of this patent is extended or adjusted under 35 U.S.C. 154(b) by 163 days.

This patent is subject to a terminal disclaimer.

(21) Appl. No.: 17/316,076

(22) Filed: May 10, 2021

(65) Prior Publication Data

US 2021/0261019 A1    Aug. 26, 2021

Related U.S. Application Data

(63) Continuation of application No. 16/442,209, filed on Jun. 14, 2019, now Pat. No. 11,001,167.

(51) Int. Cl.
*B60Q 1/00*     (2006.01)
*B60N 2/00*    (2006.01)
(Continued)

(52) U.S. Cl.
CPC ............ *B60N 2/002* (2013.01); *B62D 1/046* (2013.01); *G01D 5/2417* (2013.01); *H05K 1/095* (2013.01); *H05K 3/12* (2013.01); *H05K 3/246* (2013.01)

(58) Field of Classification Search
CPC ...... B60N 2/002; B62D 1/046; G01D 5/2417; H05K 1/095; H05K 3/12; H05K 3/246;
(Continued)

(56) References Cited

U.S. PATENT DOCUMENTS 8,154,395 B2 * 4/2012 Taylor ................... G08B 21/24
340/425.5
9,159,221 B1 * 10/2015 Stantchev .............. G08C 17/02
(Continued)

OTHER PUBLICATIONS

International Search Report and Written Opinion issued for Application No. PCT/US2019/037309, dated Nov. 5, 2019.

*Primary Examiner* — Anh V La
(74) *Attorney, Agent, or Firm* — Meunier Carlin & Curfman LLC

(57) ABSTRACT

An occupant or object sensing system in a vehicle includes electrical circuits for capacitive sensing and corresponding circuits shielding the sensing system from interference. A sensing circuit and a shielding circuit may be printed by screen printing with conductive ink on opposite sides of a non-conductive substrate. The substrate is a plastic film or other fabric that has an elastic memory structure that is resilient to stretching. The conductive inks used to print circuits onto the substrate have a similar resilience to stretching such that the substrate and the circuits thereon can be subject to deforming forces without breaking the printed circuits. The substrate may be covered with a carbon polymer layer to provide alternative conductive paths that enable fast recovery for conduction in the presence of any break in the printed conductive traces on the substrate.

20 Claims, 7 Drawing Sheets

(51) Int. Cl.
  *B62D 1/04* (2006.01)
  *H05K 3/12* (2006.01)
  *H05K 1/09* (2006.01)
  *H05K 3/24* (2006.01)
  *G01D 5/241* (2006.01)

(58) Field of Classification Search
  CPC ....... H05K 2201/09681; H05K 1/0218; H05K 2201/10151; H05K 1/0283
  USPC .................. 340/425.5, 426.24, 407.2, 407.1; 345/173, 174; 29/622
  See application file for complete search history.

(56) References Cited

U.S. PATENT DOCUMENTS

| | | | |
|---|---|---|---|
| 9,248,851 | B2 | 2/2016 | Van Tzelfde |
| 9,340,153 | B2 | 5/2016 | Kim et al. |
| 9,434,431 | B2 | 9/2016 | Kim et al. |
| 9,452,780 | B2 | 9/2016 | Schumacher et al. |
| 9,604,649 | B1 | 3/2017 | Pastor et al. |
| 11,001,167 | B2 * | 5/2021 | Wilson .................. B62D 1/046 |
| 11,198,462 | B2 * | 12/2021 | Trachte .................. G06F 3/0447 |
| 2007/0188180 | A1 | 8/2007 | Deangelis et al. |
| 2010/0013785 | A1 | 1/2010 | Murai et al. |
| 2011/0141052 | A1 | 6/2011 | Bernstein et al. |
| 2013/0082970 | A1 | 4/2013 | Frey et al. |
| 2014/0303287 | A1 | 10/2014 | Li et al. |
| 2015/0344060 | A1 * | 12/2015 | Staszak .............. H03K 17/9622 324/697 |
| 2016/0103545 | A1 | 4/2016 | Filiz et al. |
| 2016/0200086 | A1 | 7/2016 | Dolezal et al. |
| 2017/0059417 | A1 | 3/2017 | Kim et al. |
| 2018/0274952 | A1 | 9/2018 | Sleeman et al. |
| 2019/0036527 | A1 | 1/2019 | Dolcetti |
| 2019/0226879 | A1 * | 7/2019 | Lakatos .................. G01D 5/24 |

\* cited by examiner

APPARATUS AND METHOD OF PRODUCING A SENSING SUBSTRATE

This application is a continuation of and claims priority to U.S. patent application Ser. No. 16/442,209 filed on Jun. 14, 2019, now U.S. Pat. No. 11,001,167, entitled Apparatus and Method of Producing a Sensing Substrate, which is incorporated by reference herein.

BACKGROUND

Current implementations of capacitive sensing technologies are often configured for placing around automobile steering wheels or possibly for positioning within a vehicle seat so that conductive objects, like a human body, can induce electrical responses in the sensing systems that are useful for occupant detection. In earlier embodiments, a system for utilizing capacitive sensing techniques may include a sensor mat having an electrical circuit thereon that detects the presence of one or more parts of a human body or other object in proximity to the sensor mat. In these installations, the sensor mat is often disposed between an outer section of a steering wheel and a rim of a steering wheel frame. The steering wheel frame is typically made of metal, such as a magnesium alloy or steel, and can be a source of interference (e.g., without limitation, parasitic capacitance and/or undesirable electromagnetic responses) that distort the electrical signal(s) in the sensor mat. In other installations, a vehicle seat may include a capacitive sensing system that is near a similar metal infrastructure that can interfere with capacitive sensing operations that are useful for occupant detection systems.

Traditional capacitive sensors and their associated shielding systems are often layered assemblies that include a sensor mat, a shielding layer, and/or a heating mat that collectively allow for physical detection of an occupant's body, an occupant's position in a vehicle, or placement of an object in a vehicle. Generally, in prior embodiments, a power source provides a voltage signal to a shield mat to provide electrical shielding for a sensor mat. Interference with the electrical signal(s) carried by the sensor mat may occur due to the proximity of the sensor mat to a metal object such as a steering wheel or seat frame, and providing the shielding voltage signal to the shield mat prevents this interference. In addition, the system may also include a heater mat. The heater mat may be separate from the shield mat or it may be used as a combination heater and shielding mat. To use the heater mat as a shield mat, the power source generates a heating current for heating the steering wheel or the shielding voltage signal for using the heater mat as a shield mat. The heating current is greater than a shielding current.

Problems arise, however, when layered assemblies are too thick or bulky for installing in conjunction with various components of a vehicle, or the materials used in the layers are not amenable to forming into a desirable shape for a given application. Accordingly, there is a need in the art for improved systems and methods for making a capacitive sensor system, that includes an associated shielding apparatus, such that the sensor and shield can be placed in more diverse areas of a vehicle body. Of course, all improvements to the structures of a capacitive sensing system must still reliably provide changes in electrical outputs that can be used for numerous occupant detection and occupant safety purposes.

BRIEF SUMMARY

Systems and methods of shielding a sensor system in a vehicle are disclosed herein.

In one embodiment, a substrate includes a non-conductive sheet having a first face and a second face with respective conductive traces adhered to the first face and the second face. The sheet and the traces each comprise flexible compositions with mutual resilience to stretch and contract in conjunction with one another. The resilience maintains structural continuity of the conductive traces in the presence of deforming forces upon the sheet.

In a different embodiment, a substrate includes a non-conductive base material having a first face and a second face with respective conductive traces adhered onto the first face and the second face. The base material and the traces each have flexible compositions with a mutual resilience allowing the base material and the conductive traces to stretch and contract in conjunction with one another and maintain electrical continuity of the conductive traces in the presence of deforming forces upon the substrate. This embodiment may further include a first carbon polymer layer connected to the first face of the substrate and a second carbon polymer layer connected to the second face of the substrate.

In another embodiment, the carbon polymer layers extend over and between the conductive traces for additional redundancy in electrical conductivity.

A method of printing the conductive traces on the substrate is also disclosed below.

BRIEF DESCRIPTION OF THE DRAWINGS

The components in the drawings are not necessarily to scale relative to each other. Like reference numerals designate corresponding parts throughout the several views.

DETAILED DESCRIPTION

Apparatuses, systems and methods of electronically sensing occupants and other objects within a vehicle, along with appropriate shielding mechanisms to account for electrical interference, are disclosed herein. Certain examples of capacitive sensing apparatuses are explained in the context of a hand placement detection system that is particularly useful for steering wheel applications, but such descriptions are not limiting of this disclosure. The concepts described herein are equally applicable to occupant and object sensing technologies that can be placed within or proximate to any vehicle component that would benefit from electronic sensing, associated shielding functions, and computerized analysis techniques that provide control data to vehicle data management systems. Terms used in this disclosure, therefore, are intended to imply their broadest meaning. For example, references to "vehicles" include all forms of transportation apparatuses in which occupants move from one destination to another. In fact, certain physical implementations of a sensing system may be useful in numerous kinds of electronic sensing environments, and the term "capacitive" sensing is not intended to be the sole technology sector that can utilize the structures described below.

Figure 1:
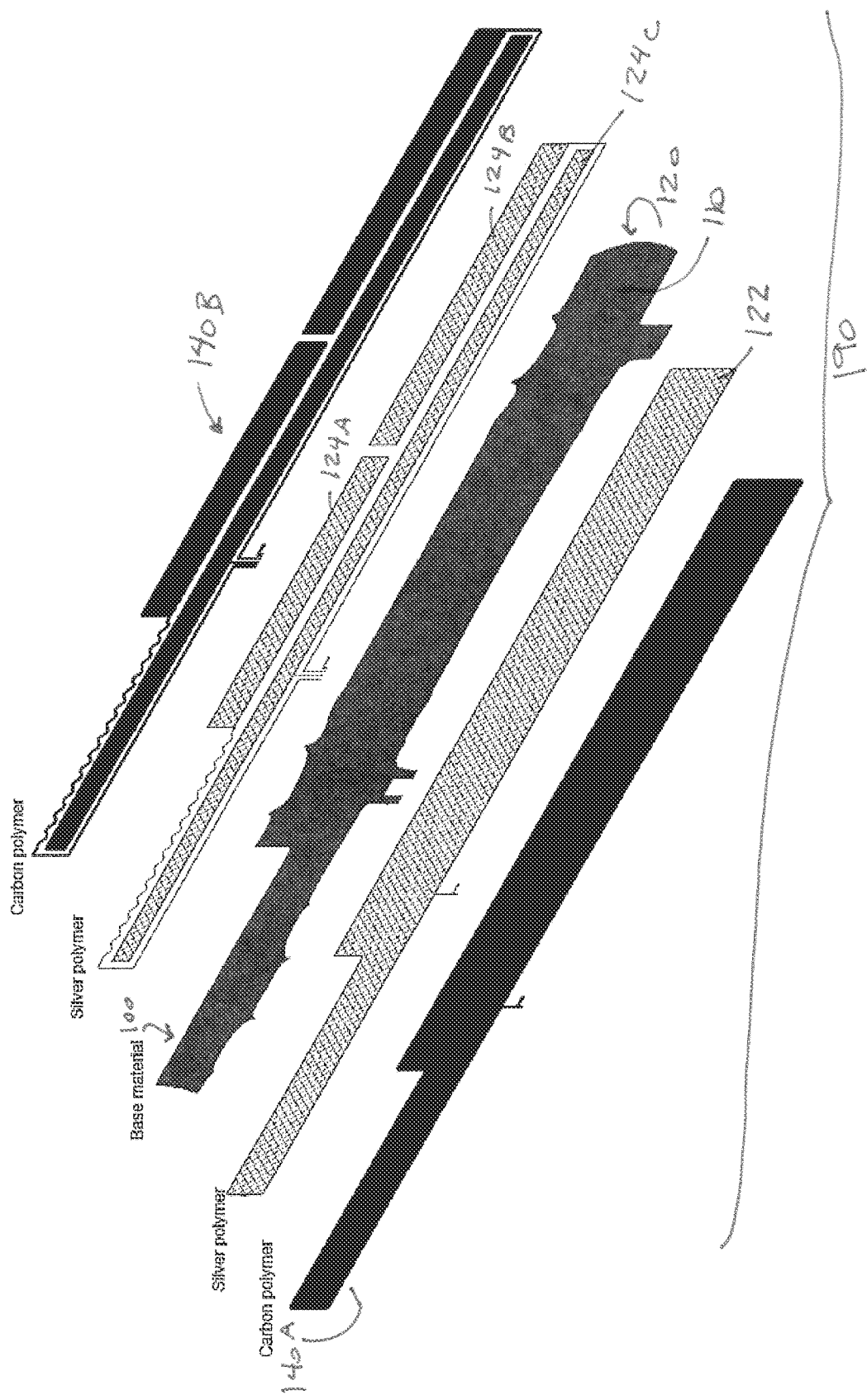
FIG. 1 illustrates an exploded view of layers in a sensor mat according to one implementation.

One non-limiting implementation of capacitive sensing technologies is a sensor system that includes a substrate 190 configured for placement in or on multiple structures within the interior of a vehicle. As illustrated in FIG. 1, a substrate 190 may include a base material, layer or sheet 100 that allows for constructing both a sensor circuit 124A, 124B, 124C and a shield circuit 122 thereon with a minimal number of layers. In fact, by utilizing printing operations and conductive ink products, both the sensor circuits 124A, 124B, 124C and the shield circuits 122 can be formed on opposite sides 110, 120 of a single layer (i.e., a single mat) 100. In this embodiment, a substrate 190 for placing in a sensing system within a vehicle includes a non-conductive sheet 100 having a first face 110 and a second face 120. Respective conductive traces 122, 124A-C are printed onto and adhered to the first face and the second face of the sheet. In one embodiment described below, the conductive traces may be screen printed onto the opposite faces 110, 120 of the substrate in a silver polymer ink as illustrated in FIG. 1. In non-limiting examples, the sheet 100 may be a thin nylon fabric that is between 0.10 mm and 0.2 mm thick. The conductive traces described herein may be between 0.10 mm and 0.15 mm thick.

Figure 3:
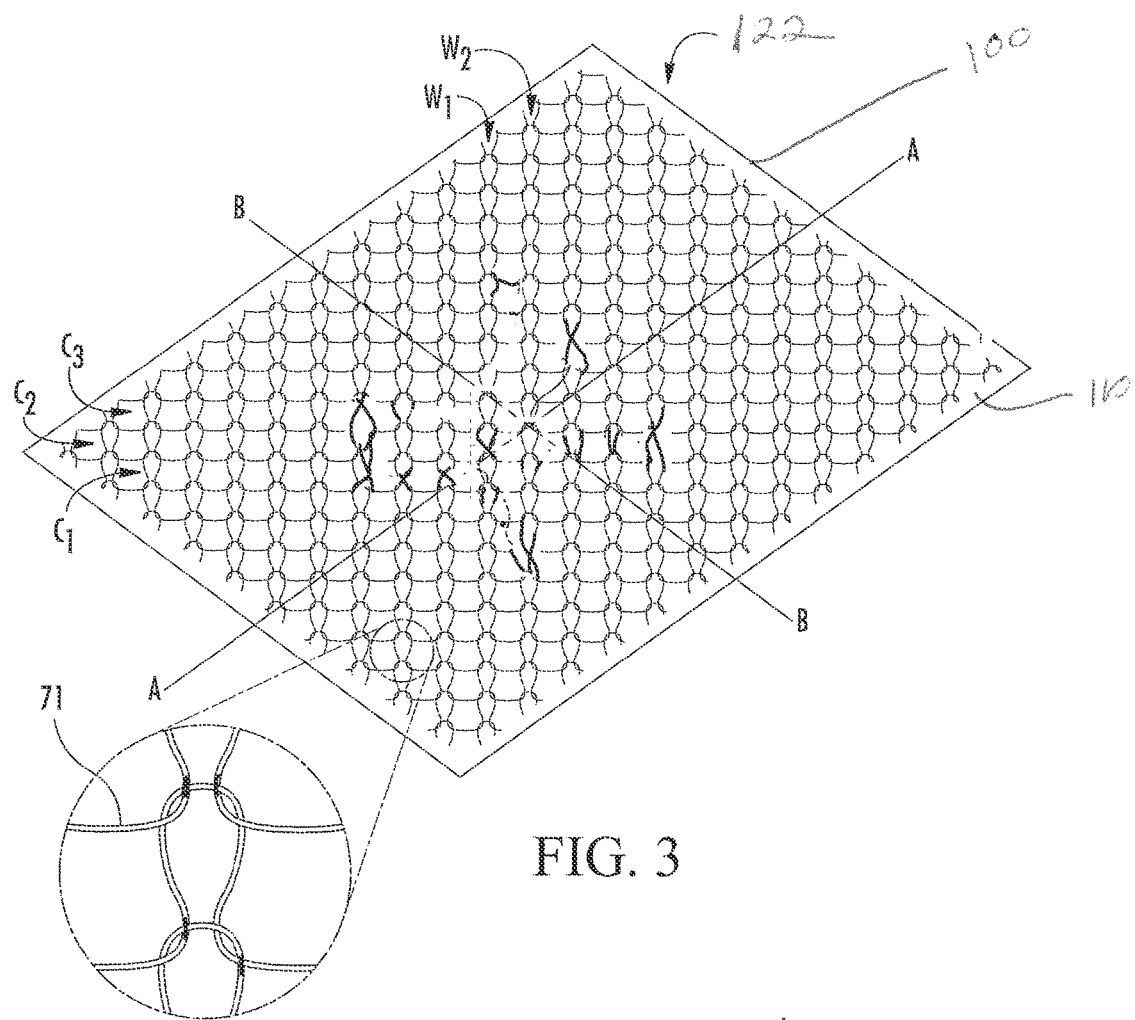
FIG. 3 illustrates a perspective view of a first example circuit pattern printed onto a sensor mat according to one implementation.
Figure 4:
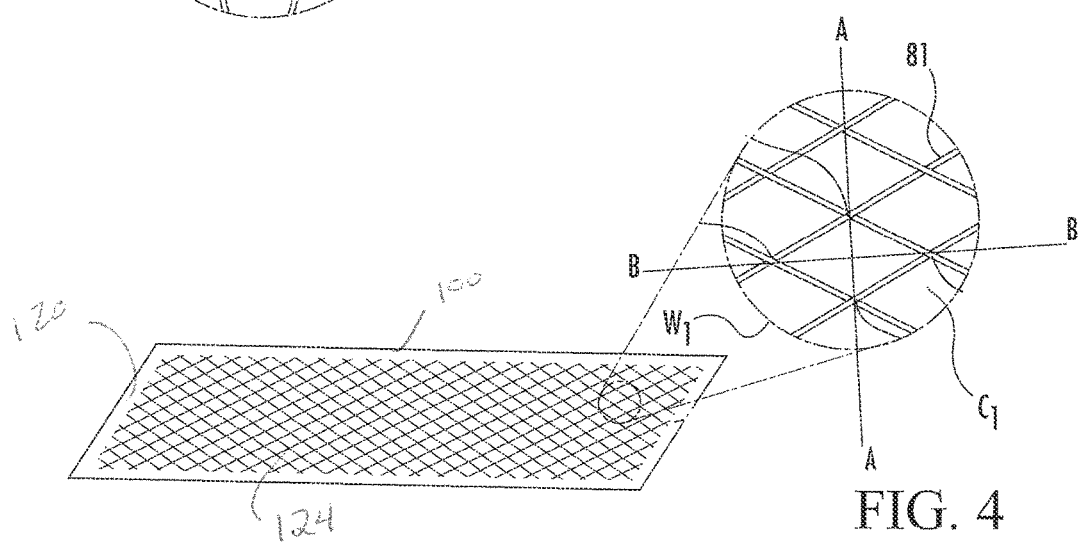
FIG. 4 illustrates a perspective view of a second example circuit pattern printed onto a sensor mat according to one implementation.

One non-limiting goal of the described embodiments is to provide a sensing and shielding structure that can be positioned within hard-to-fit vehicle components of numerous shapes, contours, and sizes inside a vehicle. To accomplish this goal, the sheet 100 and the traces 122, 124A-C each comprise flexible compositions with a mutual resilience that allows the substrate and the traces to stretch and contract in conjunction with one another. The term mutual resilience is intended for descriptive purposes only, but in general, the resilience of the non-conductive sheet 100 and the electrically conductive traces 122, 124A-C is coordinated to maintain structural and electrical continuity of the conductive traces in the presence of deforming forces upon the sheet. The sheet 100 and the conductive traces 122, 124A-C are designed with stretching parameters that overlap so that deforming forces cannot stretch or contract the overall substrate 190 in a manner that breaks stretching limits for either or both of the sheet 100 and the conductive traces 122, 124A-C thereon. In other words, the sheet can be molded, shaped, folded, and most importantly, stretched to comply with design considerations without breaking the circuits formed by the conductive traces. The sheet and the conductive traces are configured to withstand deforming forces that stretch a dimension of the sheet in any direction by an amount between 2 percent and 10 percent. FIGS. 3 and 4 illustrate that conductive traces 122, 124A-C on opposite sides of the sheet 100, as well as the sheet itself, can have length and width dimensions along axes A-A and B-B. Accordingly, the mutual resilience between the non-conductive sheet 100 and the respective traces 122, 124A-C on opposite sides 110, 120 of the sheet give the substrate 190 a memory shape effect, allowing the entire substrate 190 to be subject to stretching, contracting, or other deforming forces along the axes without breaking the conductive traces and the resulting shielding and sensing circuits.

FIGS. 3 and 4 show that the conductive traces 122, 124A-C define a first pattern 71 on the first face 110 of the non-conductive sheet 100 and a second pattern 81 on the second face 120 of the sheet 100. In other embodiments, the first and second patterns 71, 81 may be similar or even identical. In one non-limiting example, the conductive traces on the opposite faces of the sheet operate similarly to separate sensor mats and shielding mats of multi-layered capacitive sensing devices, but with much more flexibility in design and more possible uses that require space saving efficiency not seen in prior devices.

In one non-limiting embodiment, FIG. 3 illustrates one implementation of a printed metallic mesh layer in which metallic traces 122 are printed together in a way that resembles a weft knit pattern and are printed on a first side of a non-conductive sheet described above to form a mesh shield circuit 7. FIG. 4 illustrates how a different pattern on a second side 120 of the non-conductive sheet 100 can form a mesh layer in which metallic traces 124A-C are printed to a second pattern 81. The patterns shown in FIGS. 3 and 4 allow the mesh shield circuit paths and sensor circuit paths in the respective patterns to maintain contact when stretched, which maintains electrical conductivity through the mesh print after the substrate 190 is secured to the steering wheel rim. These patterns are exemplary, and other suitable knit-like patterns may be used in other implementations. The printed mesh can stretch about 2 percent to about 10 percent along axis A-A or axis B-B in the presence of about 100 N of force without interfering with the conductive properties of the traces, according to certain implementations. In another embodiment, the printed mesh and the base material sheet 100 may be characterized as stretching about 5 percent to 8 percent for every 100 N of force.

During installation of the printed mesh shield circuit 7, 122 on the steering wheel rim, the overall substrate 190 is stretched along the A-A axis and the B-B axis. This arrangement of the mesh layer improves contact between the adjacent traces to withstand such deforming forces on the substrate.

In certain implementations, the printed mesh shield circuit 7, 122 may include one mesh layer area that provides one conductive zone adjacent the base layer 100. However, in other implementations (not shown), the mesh shield circuit 7, 122 may comprise a plurality of separate mesh layer areas that are spaced apart and separated from each other on the non-conductive sheet 100 but are electrically coupled together to provide one conductive zone adjacent each of the plurality of mesh layer areas. Such an implementation provides targeted shielding to a particular area of the steering wheel and reduces the amount of mesh layer used for the mesh shield circuit 122. In another implementation (not shown), the plurality of separate mesh layer areas may not be electrically coupled and are instead coupled separately to the power source to provide separate conductive zones that can be activated separately. The same parallel construction is available for zones in the sensing circuits 124A, 124B, 124C.

As noted, one aspect of a substrate 190 according to this disclosure is the ease with which the substrate 190 can be stretched for molding into a particular shape for a given application. In this regard, the non-conductive sheet 100 may be described as an elastic memory sheet having a sheet width dimension and a sheet length dimension along respective axes A-A and B-B shown in FIGS. 3 and 4. Similarly, each of the first and second patterns 71, 81 have a corresponding, respective pattern width dimension and a respective pattern length dimension along respective axes. In one example that is not limiting of this disclosure, the sheet width dimension and the respective pattern width dimensions stretch and contract by an amount of 2 percent to 10 percent, simultaneously, in the presence of the deforming forces along a corresponding axis A-A or B-B. Similarly, the sheet length dimension and said respective pattern length dimensions stretch and contract by an amount of 2 percent to 10 percent, simultaneously in the presence of the deforming forces along the other axis A-A or B-B. Deforming forces on the sheet may include at least one of tensile forces, compressive forces, shear forces, and combinations thereof, such as forces used for installing or molding the substrate 190 for placement on or within a corresponding vehicle component (e.g., around a steering wheel, along an A-pillar or B-pillar, in a seat, or even on an accessory such as a parking brake, a visor, a head rest, or a dash board accessory of the vehicle).

Figure 5:
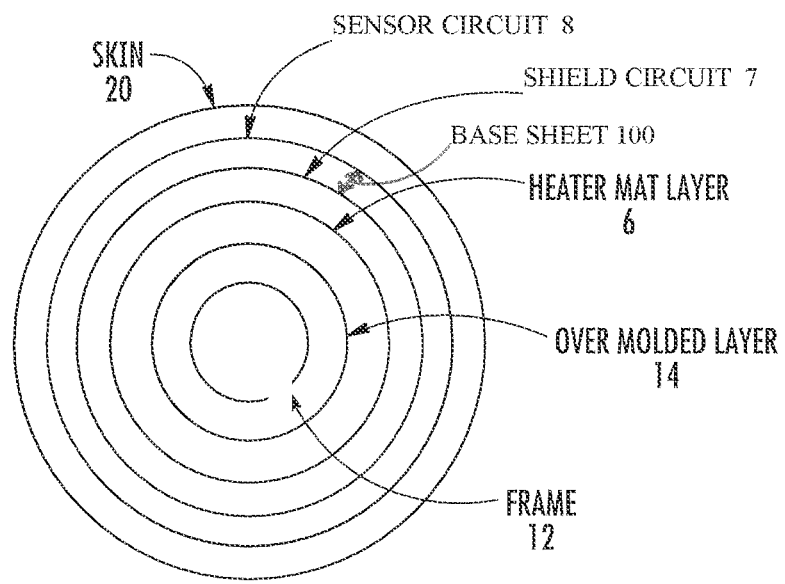
FIG. 5 illustrates a schematic diagram of a steering wheel system utilizing a sensor mat having printed circuits thereon according to the embodiments herein.

The conductive traces 122, 124A-C of the substrate 190 form respective sensing circuits 8 and shielding circuits 7 on a single base sheet 100 (FIG. 5). The non-conductive nature of the sheet 100 prevents short circuits through the sheet and controls both a sensing capacitance and parasitic capacitance levels in a sensing operation. In one embodiment, the conductive traces 122, 124A-C are formed by printing, preferably but not exclusively screen printing, the conductive traces, and then either curing the conductive traces at a pre-defined temperature or letting the conductive traces dry on each side of the sheet before use. In this regard, all of the conductive traces on the opposite sides of the sheet form a solidified derivative structure of a fluidic and printable composition, such as a conductive ink. In one embodiment, the solidified derivative structure is a stretchable conductive ink, such as a silver polymer ink shown in FIG. 1.

As noted, the substrate 190 is used for electrical sensing systems in a vehicle and may incorporate a base layer 100 in the form of a non-conductive sheet that is also flexible, conducive to forming multiple shapes, and can be stretched for placement on or within a vehicle component. The non-conductive sheet 100 may be a film that supports the conductive traces 122, 124A-C without allowing any short circuits through the sheets. The sheet may be a plastic film and may be selected from numerous polymeric materials including films selected from polyethylene terephthalate (PET), polyethylene naphthalate (PEN), polyimide plastics (PI), and combinations thereof. Other sheets may be more conducive to stretching as described above and be formed of a plastic film comprises a thermoplastic polyurethane film. The plastic film is impervious to a conductive ink used to form the conductive traces. In other embodiments, the non-conductive sheet may be a fabric, including at least one of woven fabrics, non-woven fabrics, and combinations thereof. For fabrics that would ordinarily absorb the conductive inks and cause bleed-through problems (and short circuits between the opposite faces 110, 120), the fabric may include a surface finish that enables screen printing and is resistant to the fabric absorbing a conductive ink used to form the respective traces. To accomplish a dual sided circuit on the substrate, fabric or a film has a sufficient surface energy to promote adhesion of the conductive traces.

In another embodiment, a substrate for use in electrical sensing of occupants and other objects in a vehicle has a sensing circuit 8, 124A, 124B, 124C and a shielding circuit 7, 122 on opposite faces 110, 120 of the same sheet 100. The sheet is a non-conductive base material having a first face 110 and a second face 120 and respective conductive traces adhered onto the first face and the second face. The base material and the traces are both formed of flexible compositions with a mutual resilience allowing the base material and the conductive traces to stretch and contract in conjunction with one another and maintain electrical continuity of the conductive traces in the presence of deforming forces upon the substrate. In this embodiment, the substrate may also include a first carbon polymer layer 140A connected to the first face 110 of the sheet 100 and a second carbon polymer layer 140B connected to the second face 120 of the sheet 100. In the example of FIG. 1, the respective conductive traces include a first silver polymer conductive trace on the first face and a second silver polymer conductive trace on the second face. FIG. 1, as well as numerous other figures in this disclosure, show that one set of the conductive traces 124A, 124B, 124C (i.e., the second silver polymer conductive trace) is formed into a plurality of zones of the conductive traces. The use of different zones for sensing circuits is discussed further below.

The substrates 190 used for sensing circuits 8, 124A-C and shielding circuits 7, 122 as discussed herein may be configured for manufacturing with printing processes that form the conductive traces thereon. In a method of forming the circuits, a first step includes applying respective fiducials to a first face 110 and a second face 120 of a flexible fabric, sheet, or film layer (base material 100) to guide a printing process. Next, the sheet is held in place at a constant tension and maintained in stable dimensions for printing a first conductive trace 122 of a first pattern 71 on the first face 110 of the flexible base material. The method further includes printing a second conductive trace 124 of a second pattern 81 on the second face 120 of the flexible base material, wherein the printing is completed according to a placement of the fiducials. The first and second pattern can be entirely distinct from one another as shown in FIGS. 3 and 4, or the patterns can be similar or even identical so far as a general pattern is concerned. In one method, the fiducials are screen print fiducials and the printing is screen printing with a conductive ink. Prior to printing the second conductive trace, a manufacturing method includes applying at least one of the respective fiducials to the second face and screen printing the second conductive trace. Prior to applying the at least one of the respective fiducials, a step includes drying the first conductive trace and turning the flexible fabric to print on the second face. The respective fiducials define the second conductive trace as a plurality of zones for sensing different aspects of a vehicle occupant's position or body parts at different regions along the substrate. In one optional step, the method further includes applying a carbon polymer to at least one side of the flexible fabric.

In yet another embodiment, a substrate 190 used in capacitive sensing technologies within a vehicle includes a non-conductive base material 100 having a first face 110 and a second face 120. Respective conductive traces 122, 124A-C define respective patterns 71, 81 adhered onto the first face and the second face, wherein said patterns define a plurality of redundant electrically conductive pathways across regions of the patterns. The base material and the traces are both made of flexible compositions with a mutual resilience allowing the base material and the conductive traces to stretch and contract in conjunction with one another and maintain electrical continuity of the conductive traces in the presence of deforming forces upon the substrate. A first carbon polymer layer 140A is connected to the first face 110 of the base material 100, and a second carbon polymer layer 140B is connected to the second face 120 of the sheet. The carbon polymer layers extend over and between the conductive traces for additional redundancy in electrical conductivity. The carbon polymer layers 140A, 140B are configured as respective protective coatings, but the carbon polymer layers also serve as capacitive plates on opposite sides of the base material or non-conductive sheet or fabric. The carbon polymer material is deposited over the respective traces and into wells C1, C2, C3 and W1, W2 formed between the traces 122, 124A-C. The resulting carbon polymer plate, positioned over the sensing circuit, is conductive to an extent that provides a consistent electrical plate as part of a capacitive circuit component formed between the sensing circuits 124A-C on the substrate 190 and a human body part or other conductive object proximate the conductive capacitor plate formed by the carbon polymer later 140B. In one non-limiting embodiment, the carbon polymer layer is about 0.015 mm thick. On the opposite side 110, the respective carbon polymer 140A, is a capacitor plate controlling the presence of parasitic capacitance or undesirable electromagnetic forces relative to an oppositely positioned metal part, such as a steering wheel frame or seat construction. The carbon polymer layer is less conductive than the conductive traces but is still sufficiently conductive to increase the surface area of a sensing circuit and a shielding circuit in which active electrical responses are present.

As noted above, the conductive traces on opposite sides of the substrate can be connected to electrical circuits and used for capacitive sensing and shielding functions in the vehicle as part of occupant monitoring, safety systems, or accessory control systems in a vehicle. In some non-limiting embodiments and only for example herein, a substrate 190 having a sensing circuit and a shielding circuit thereon may be wrapped around a steering wheel in a construction similar to that of FIGS. 2 and 5. FIG. 5 illustrates a cross section of a steering wheel rim that could include a substrate 190 as shown in FIG. 1. The steering wheel embodiment includes a frame 12, an over molded layer 14 around the frame 12, and an optional heater mat layer 6 around the over molded layer 14. The substrate 190 described herein provides a shield circuit 7 formed of the respective conductive traces 122 on a first side 110 of a non-conductive sheet, fabric, or film 100 of a substrate 190. The shield circuit 7 could be formed of a printed conductive ink pattern that would face the steering wheel frame 12. A sensor circuit 8 is positioned on a second side 120 of the same non-conductive sheet 100 opposite the shield circuit 7. The steering wheel may be completed with a skin 20 around the sensor circuit 8. The frame 12 is typically a magnesium alloy, aluminum alloy, steel, or a combination thereof, but it may be made of another suitable rigid material(s). The over molded layer 14 is formed from a polyurethane foam or thermoplastic elastomeric foam, for example. The outer skin 20 is typically made of leather or vinyl, but could also include wood, carbon fiber, plastic, polyurethane foam, fabrics, or any other suitable material. By keeping the shield circuit 7 directly adjacent the sensor circuit 8, the distance fluctuation between the two circuits is controlled by a known sheet thickness that does not vary widely because opportunities for thermal expansion and contraction are minimized. In addition, the distance between these layers is further minimized by the tension of the outer skin 20 squeezing substrate and other components of the steering wheel assembly together.

Figure 6:
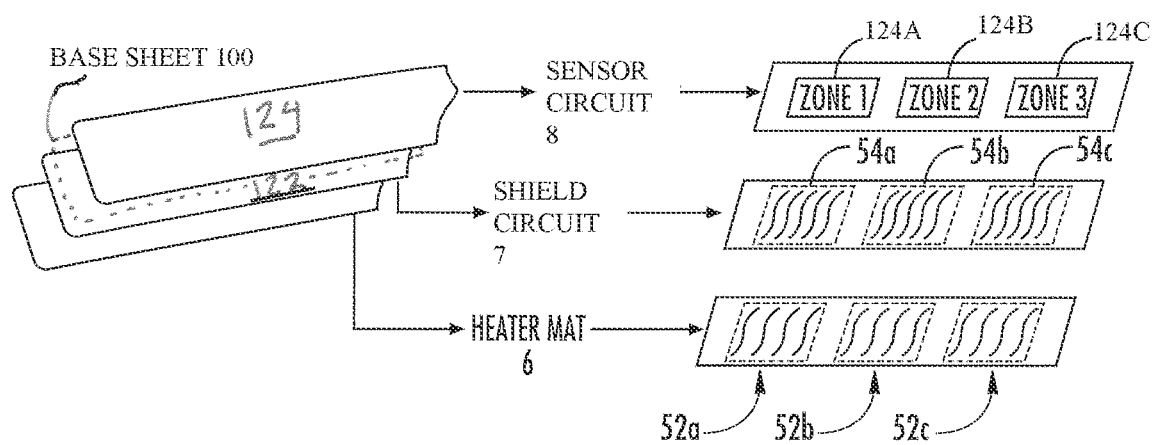
FIG. 6 illustrates a schematic diagram of a steering wheel system using the sensor mat according the embodiments herein with a heater mat according to another implementation.

FIG. 6 illustrates a perspective view of the substrate 190 described as supporting a sensor circuit 8, shield circuit 7, alongside a heater mat 6. Obviously in this application, the base material or sheet 100 must be made of a fabric or plastic that maintains structural integrity in the face of heat provided to the steering wheel (e.g., a fabric instead of a film for the base material 100) The sensor circuit 8 may include one or more sensing zones, such as sensing zones 124*a*, 124*b*, 124*c*, which are designated as zones 1-3 for example, and that are distinct and spaced apart from each other. In addition, the shield circuit 7 and the heater mat 6 may include one or more conductive zones, such as conductive zones 54*a*, 54*b*, 54*c* and 52*a*, 52*b*, 52*c*, respectively, which correspond to the sensing zones on the sensor mat and which allow for selective zone shielding and heating.

Figure 7:
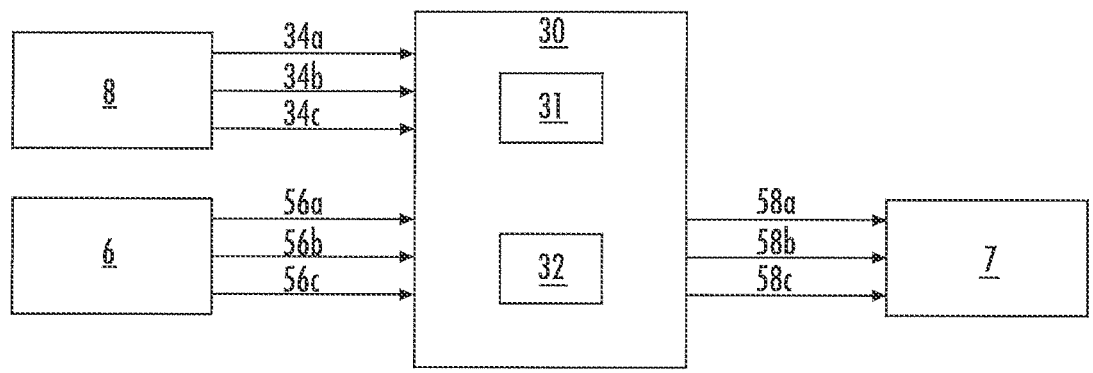
FIG. 7 illustrates a top view of a sensor mat as disclosed herein, showing a schematic area of sensing zones and selected sensor return wires from each loop associated with each zone.

An electronic control unit (ECU) 30, which is shown in FIG. 7, is in electronic communication with the heater mat 6, the sensor circuit 8, the shield circuit 7, and one or more other vehicle systems (not shown). In particular, sensor return wires 34*a*-34*c* extend between the ECU 30 and each sensing circuit 124*a*-124*c*, respectively, and conductive feed wires 56*a*-56*c* and 58*a*-58*c* extend between the ECU 30 and each conductive loop 52*a*-52*c* and 54*a*-54*c* for the heater mat 6 and the shield circuit 7, respectively. The ECU 30 includes a processor 31 and a power source 32.

The processor 31 is configured for detecting input from a driver, such as presence of a hand, adjacent each sensing loop 124*a*-124*c*. In one implementation, an electrical signal from one or more sensing loops 124*a*-124*c* is communicated to the processor 31, and the processor 31 determines if the signal indicates input from the driver. For example, the signal may be generated through capacitance-type sensing, and the processor 31 may compare the generated signal with a range of signals that indicates presence of the driver's hand or other parts of the driver's body.

In addition to being configured to detect presence of a hand or other parts of the driver's body, the sensing circuits 124*a*, 124*b*, 124*c* and the processor 31 may also be configured to detect various types of user input in each respective sensing zone, such as a grip, swipe motion, tap motion, etc., from signals received from the sensor mat. For example, by using a multi-zone sensor mat with the sensing loops disposed in specific areas, the sensor mat may be configured for detecting when no, one, or both hands are on the steering wheel and/or when a knee is touching the steering wheel. The embodiments are not limited to only sensing a human, other animal or a given body part, but the substrate 190 has appropriate circuits to sense any conductive object whether a static, inanimate object that causes an electrical response in the circuits of the substrate or a living dynamic animal or human.

Referring back to the example of FIG. 7, which is not limiting of this disclosure, the power source 32 is configured for selectively generating an electrical current through one or more conductive loops 52a-52c of the heater mat 6 for heating at least a portion of the outer skin 20 and a voltage signal through one or more conductive loops 54a-54c (i.e., the shielding circuit 7, 122) for shielding at least a portion of the sensor circuit 8, 124A-C from interference from the steering wheel frame 12. The heating current is greater than a shielding current. For example, the heating current is around 4 to around 8 amperes, which is sufficient for producing heat for heating the skin 20 of the steering wheel, and the shielding current is less than about 200 microamperes, which is sufficient for shielding the sensor mat 8 from the steering wheel frame 12, according to some implementations. In certain implementations, for example, the shielding current may be between about 9 to about 11 microamperes. In one particular implementation, the heating current may be about 7 amperes and the shielding current may be around 10 microamperes. These electrical current values may be per zone or per channel and are input into the ECU 30, according to certain implementations.

In one implementation (not shown), the ECU 30 may include at least a first circuit and a second circuit between the power source 32 and the conductive loops 52a-52c and 54a-54c, respectively. The first circuit receives the heating current, which is a simple, resistive voltage current, to heat the area adjacent the conductive loops 52a-52c. The second circuit receives the shielding current, which may be a frequency-specific signal, for example, to shield the area adjacent the conductive loops 54a-54c. The frequency-specific signal of the second circuit is configured for matching, as close as possible, the capacitance voltage signal generated for the sensing mat.

The level of heating current, sensing voltage level or shielding voltage signal to be generated by the power source 32 is controlled by the processor 31, according to one implementation. For example, in various implementations, the processor 31 may be configured to instruct the power source 32 to generate the heating current in one or more conductive loops 52a-52c in response to receiving input from a button, switch, or other suitable input mechanism disposed on the steering wheel or elsewhere in the vehicle. In another implementation, the processor 31 may be configured for generating the heating current in response to receiving input from one or more sensing loops 124a-124c. For example, in a particular implementation, the processor 31 may be further configured to instruct the power source 32 to generate the heating current for a particular conductive loop(s) 52a-52c that is adjacent the particular sensing loop(s) 124a-124c that senses the presence of the driver's hand(s). This configuration allows the system to save energy by only heating those portions of the steering wheel rim for which the presence of the driver's hand is sensed. For example, if the processor 31 senses the presence of the driver's hand adjacent sensing circuit 124a, the processor 31 may generate the heating current through the conductive loop 52a that is adjacent sensing loop 124a to warm the portion of the steering wheel under the driver's hand.

In another implementation, or in addition to the implementation described above, the processor 31 may be configured for instructing the power source 32 to generate the heating current until the earlier of the steering wheel reaching a preset temperature or receiving an override signal from another vehicle system indicating that sensing in one or more zones takes priority over heating. In particular, the processor 31 may receive a temperature signal from one or more temperature sensors in the steering wheel and determine from the temperature signal whether the preset temperature has been reached. For example, a typical heater regulation range can be anywhere from about 30° C. to about 42° C. The temperature is typically detected using one or more thermistors, such as a negative temperature coefficient (NTC) type thermistor, according to certain implementations. The thermistor provides feedback to the processor 31, and the processor 31 uses the temperature feedback to regulate the target temperature on the steering wheel.

In addition, the override signal may indicate to the processor 31 that another system should receive electrical resources that would otherwise be allocated to the heater mat 6 for the heater function or that input from the sensor mat 8 takes priority over heating.

In another implementation, or in addition to the implementation described above, the processor 31 may be configured for instructing the power source 32 to alternate generation of the heating current and the shielding voltage signal periodically, such as alternating every about 10 to about 50 milliseconds. In other implementations, the period may be between about 10 to about 100 milliseconds. The period of alternation may be set based on the speed of the processor 31, the outside or inside temperature, or the preferences of the driver, for example. In addition, on board temperature monitoring may affect the timing, such as to prevent overheating of the controller itself. Or, if a specific fault condition is detected and the ECU 30 needs to prioritize managing that fault condition, the timing may be affected.

Figure 8:
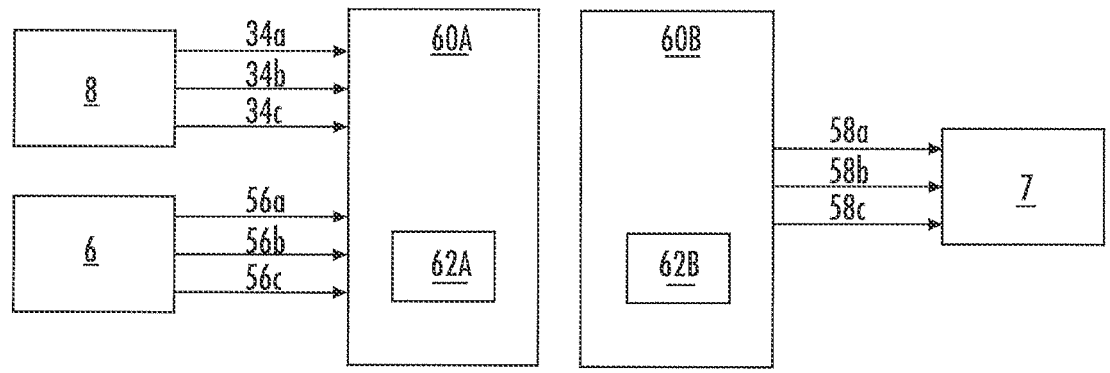
FIG. 8 illustrates a top view of a sensor mat as disclosed herein, showing a schematic area of sensing zones and a different set of selected sensor return wires from each loop associated with each zone.
Figure 9:
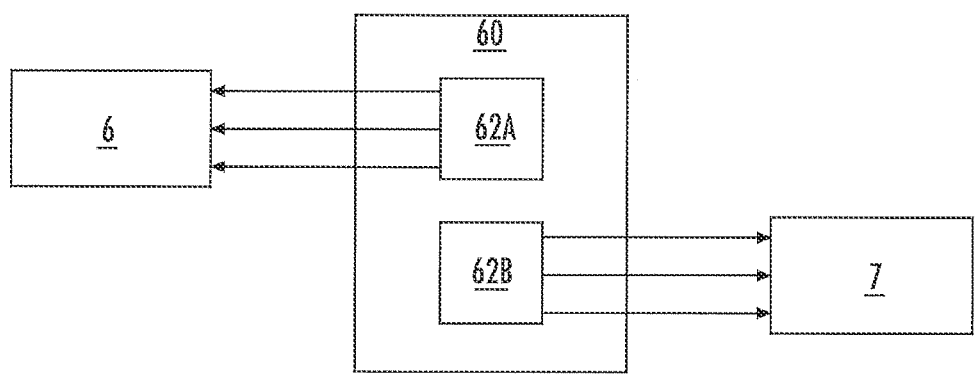
FIG. 9 illustrates a top view of a sensor mat as disclosed herein, showing a schematic area of sensing zones and a different set of selected sensor return wires from selected circuits associated with each zone.

In the alternative implementation shown in FIG. 8, a first power source 62A is provided for generating a heating current for the heater mat 6 and a second power source 62B is provided for generating a shielding voltage signal for the shield circuit 7. The first 62A and second power sources 62B are shown in FIG. 8 as being within two separate ECUs 60A, 60B, respectively, but, alternatively, these may be included in one ECU 60, as shown in FIG. 9. These implementations allow the system to provide for continuous shielding and heating when desired, for example. In addition, ECU 60A or 60 may include a first circuit for receiving the heating current from power source 62A, which is a simple, resistive voltage current, to heat the area adjacent the conductive loops of heater mat 6. And, ECU 60B or 60 may include a second circuit for receiving the shielding voltage signal from power source 62B, which may be a frequency-specific signal, for example, to shield the area adjacent the conductive loops of shield mat 7.

Furthermore, in sensor circuits having multiple zones, signals carried by sensor return wires associated with each sensing zone may generate noise in the sensing loops or sensor return wires associated with adjacent zones when the wires are too close to each other. This noise decreases the ability of the sensor mat to detect presence of a hand adjacent one or more sensing zones. In addition, cross talk from a sensor return wire from one zone that crosses over another zone may result in unintended detection from another zone. Accordingly, various implementations described herein provide for shielding around at least a portion of the sensor return wires that may be disposed adjacent another sensing zone or sensor return wire to isolate the signal(s) carried by the sensor return wire(s).

Furthermore, biometric type sensors may be disposed in the vehicle to work in conjunction with hand sensing through the steering wheel using non-biometric type sensors. These biometric sensors may be disposed on the steering wheel or elsewhere in the vehicle. Examples of these biometric type sensors include retina detection, heart rate monitoring, arousal state monitoring, and driver detection (e.g., in a vehicle seat).

Figure 10:
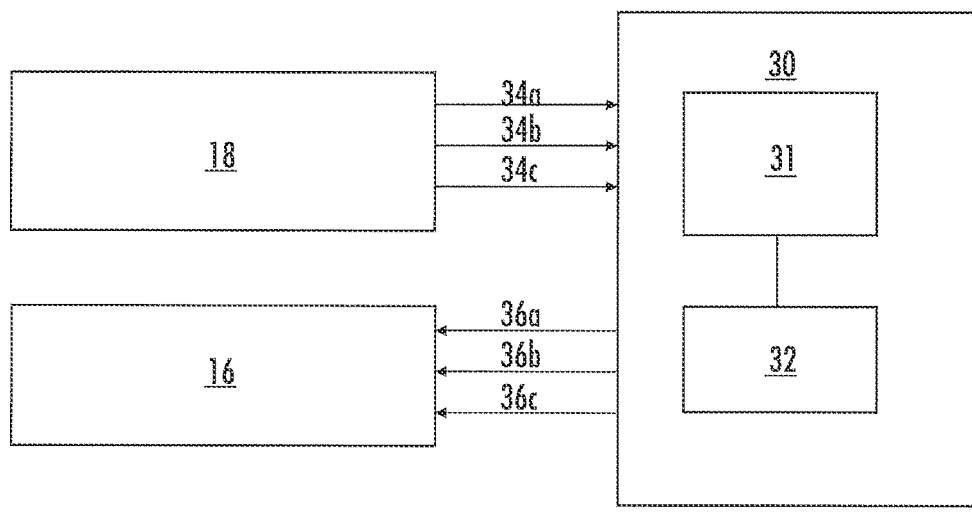
FIG. 10 illustrates a top view of a sensor mat as disclosed herein, showing a schematic area of sensing zones and a different set of selected sensor return wires from selected circuits associated with each zone.

As shown in FIG. 10, the ECU 30 is in electronic communication with the heater mat 16, the sensor circuit 18, and one or more other vehicle systems (not shown). In particular, the sensor return wires 34a-34c extend between the ECU 30 and each sensing zone and conductive feed wires 36a-36c from the heater mat 16 extend between the ECU 30 and each portion of a heater mat used with the substrate of this disclosure.

Figure 11:
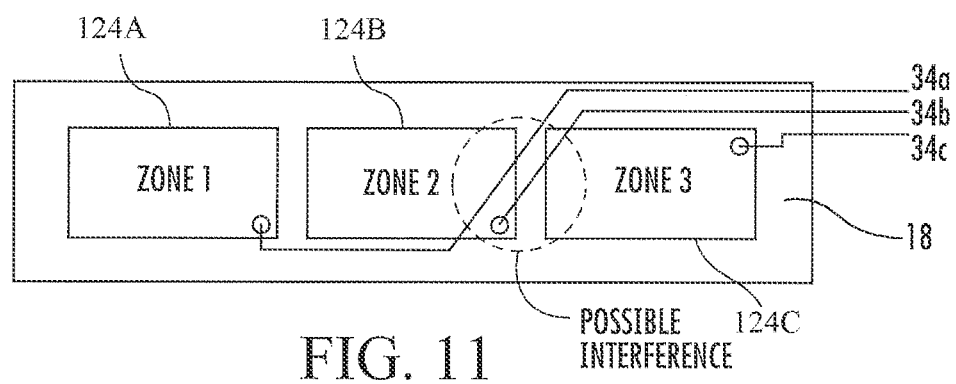
FIG. 11 illustrates a top view of a sensor mat as disclosed herein, showing a schematic area of sensing zones and a different set of selected sensor return wires from selected circuits associated with each zone.

FIG. 11 illustrates a schematic top view of the sensor circuit 18 showing the path of each of three sensor return wires 34a, 34b, 34c extending from their respective sensing circuit zones 124a, 124b, 124c. As shown, the sensor return wire 34a extends over a portion of sensing loop 124b, which may be a source for interference for sensing loop 124b. To isolate the signal carried by the sensor return wires from each other while allowing for efficient routing of wires along the sensor mat 18, one or more of the sensor return wires 34a-34c extending between the ECU 30 and the sensing loops 124a-124c may include shielding around at least a portion of the sensor return wire 34a-34c.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. While implementations will be described for steering wheel hand detection systems, it will become evident to those skilled in the art that the implementations are not limited thereto.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the sensing system for a steering wheel as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting or layering arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present embodiments.

The figures utilize an exemplary computing environment in which example embodiments and aspects may be implemented. The computing device environment is only one example of a suitable computing environment and is not intended to suggest any limitation as to the scope of use or functionality.

Numerous other general purpose or special purpose computing devices environments or configurations may be used. Examples of well-known computing devices, environments, and/or configurations that may be suitable for use include, but are not limited to, personal computers, server computers, handheld or laptop devices, multiprocessor systems, microprocessor-based systems, network personal computers (PCs), minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

In its most basic configuration, a computing device typically includes at least one processing unit and memory. Depending on the exact configuration and type of computing device, memory may be volatile (such as random access memory (RAM)), non-volatile (such as read-only memory (ROM), flash memory, etc.), or some combination of the two.

Figure 2:
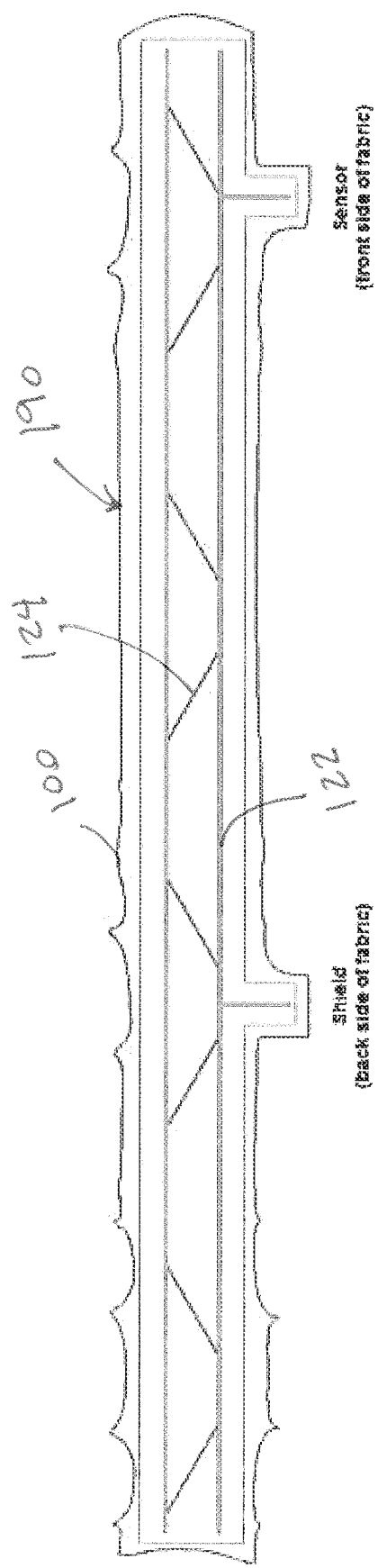
FIG. 2 illustrates a front plan view of an assembled sensor mat layer according to the implementation in FIG. 1.

Computing devices may have additional features/functionality. For example, computing device may include additional storage (removable and/or non-removable) including, but not limited to, magnetic or optical disks or tape. Such additional storage is illustrated in FIG. 2 by removable storage and non-removable storage.

Computing device typically includes a variety of computer readable media. Computer readable media can be any available media that can be accessed by the device and includes both volatile and non-volatile media, removable and non-removable media.

Computer storage media include volatile and non-volatile, and removable and non-removable media implemented in any method or technology for storage of information such as computer readable instructions, data structures, program modules or other data. Memory, removable storage, and non-removable storage are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device. Any such computer storage media may be part of computing device.

Computing device 200 may contain communication connection(s) that allow the device to communicate with other devices. Computing device may also have input device(s) such as a keyboard, mouse, pen, voice input device, touch input device, etc. Output device(s) such as a display, speakers, printer, etc. may also be included. All these devices are well known in the art and need not be discussed at length here.

It should be understood that the various techniques described herein may be implemented in connection with hardware components or software components or, where appropriate, with a combination of both. Illustrative types of hardware components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. The methods and apparatus of the presently disclosed subject matter, or certain aspects or portions thereof, may take the form of program code (i.e., instructions) embodied in tangible media, such as CD-ROMs, hard drives, or any other machine-readable storage medium where, when the program code is loaded into and executed by a machine, such as a computer, the machine becomes an apparatus for practicing the presently disclosed subject matter.

Figure 12:
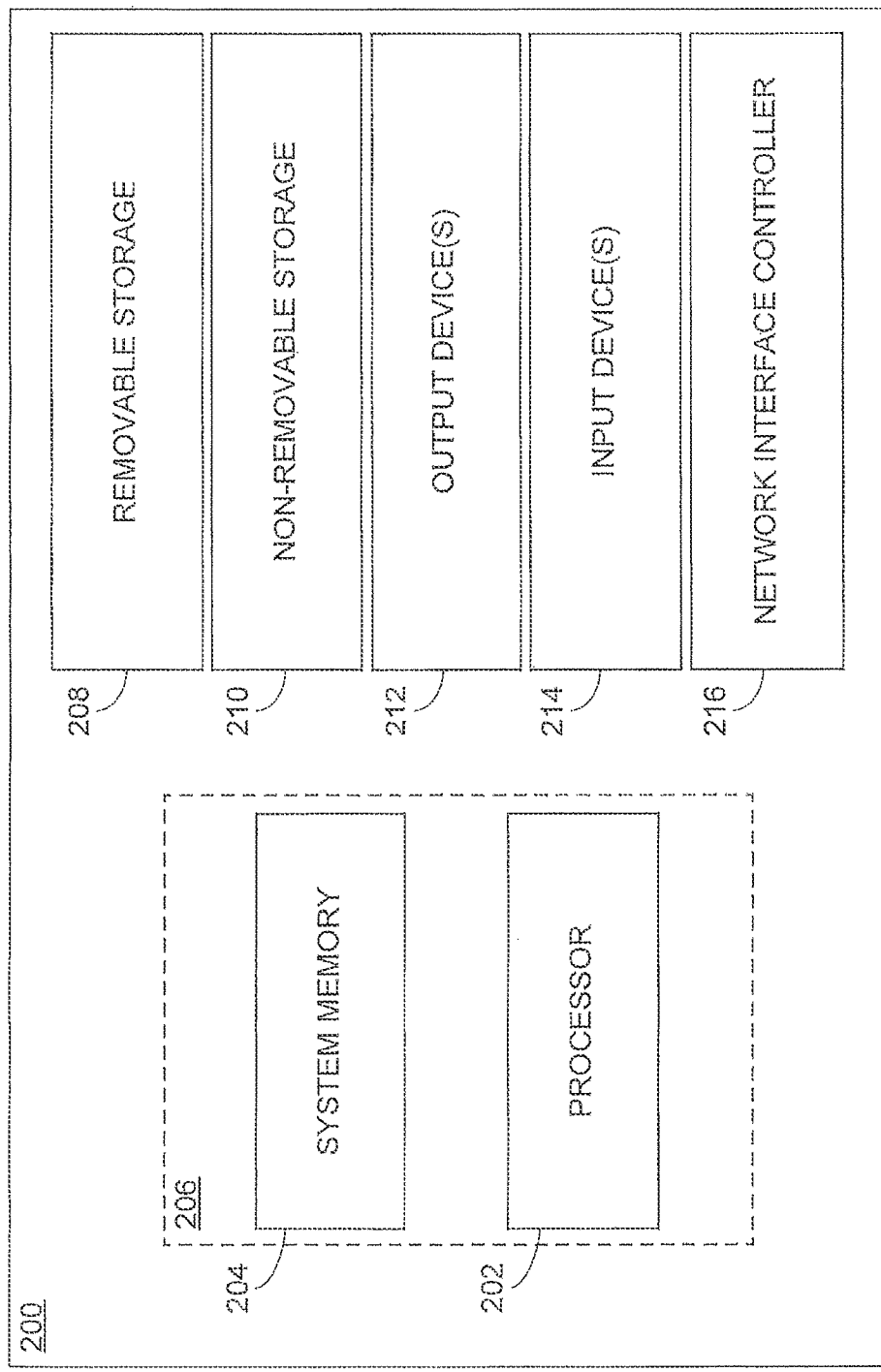
FIG. 12 illustrates a schematic view of a computer environment in which embodiments of this disclosure are implemented.

FIG. 12 illustrates an example of a computer environment in which the above described electronic control unit operates. In general, the ECU 30, designated to control sensing and shielding operations as described above, processes signals, whether power signals or data signals, received from and/or provided to the shield circuit 7, the sensor circuit 8, and a heater mat 6. With the appropriate processor 202 and memory 204, the ECU 30 can be configured with computer implemented software to ensure that the circuits in the overall shielding, sensing, and heating systems of this disclosure operate for the purposes described above. In one sense, the ECU 30 may be local to the substrate 190 of this disclosure, and in certain non-limiting embodiments, may include a somewhat basic configuration 206 that is tailored to control only the sensing, shielding, and heating circuits in a substrate installation. This local ECU 30 may also be connected to a more global vehicle control system that implements a plurality of vehicle systems and accessories with more powerful hardware configurations, generally designated as a computerized vehicle data management system 200. It is notable that a vehicle-wide data management system 200 will likely include system memory and processors, but will also incorporate more sophisticated kinds of memory devices 208, 210, multiple I/O connections 212, 214, and a network interface controller 216 for diverse data communications throughout the vehicle. In this regard, the various components of computerized systems utilized for sensing technology herein are selected to transfer data or even power signals between source devices and recipient devices according to various implementations that tailored to the use at hand. In particular, the embodiments of this disclosure may utilize any kind of computer operations capable of network connection, including accessories such as human machine interface systems (e.g., touch pad(s), touch sensitive areas on a display, and/or switches for interfacing with one or more components on a data communications network handling occupant sensing and corresponding user communications).

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A system for sensing an occupant within a vehicle, comprising:
   a steering wheel comprising a steering wheel rim;
   an electronic control unit comprising a processor connected to computerized memory storing software controlling a power supply;
   a substrate comprising:
      a non-conductive sheet having a first face and a second face;
      respective conductive traces adhered to the first face and the second face and in electronic communication with the electronic control unit and the power supply;
      wherein said sheet and said traces each comprise flexible compositions with mutual resilience to stretch and contract in conjunction with one another, said resilience maintaining structural continuity of the conductive traces in the presence of deforming forces upon the sheet;
   wherein the substrate is wrapped around the steering wheel rim.

2. A system according to claim 1,
   wherein said conductive traces define a first pattern on said first face and a second pattern on said second face,
   wherein said sheet comprises an elastic memory sheet having a sheet width dimension and a sheet length dimension;
   wherein each of said first and second patterns comprise a respective pattern width dimension and a respective pattern length dimension; and wherein said sheet width dimension and said respective pattern width dimensions stretch and contract by an amount of 2 percent to 10 percent, simultaneously, in the presence of the deforming forces.

3. A system according to claim 1, wherein a conductive trace on the first face comprises a shield circuit and a different conductive trace on the second face comprises a sensor circuit.

4. A system according to claim 3, wherein said sensor circuit comprises more than one sensing zone.

5. A system according to claim 3, wherein said shield circuit comprises more than one shielding zone.

6. A system according to claim 1, further comprising a heater mat wrapped around said steering wheel rim.

7. A system according to claim 6, wherein said power supply selectively generates an electrical current through said heater mat to heat said steering wheel rim and a voltage signal through said shield circuit to shield said sensor circuit.

8. A system according to claim 7, wherein said sensor circuit comprises more than one sensing zone;
wherein said shield circuit comprises more than one shielding zone;
wherein said heater mat comprises more than one heating zone; and
wherein said power supply generates said electrical current for at least one heating zone of said more than one heating zone that is adjacent to at least one sensing zone of said more than one sensing zone that senses a presence of a hand of the occupant.

9. A system according to claim 7, wherein said power supply generates said electrical current until the earlier of said steering wheel rim reaching a preset temperature detected by said electronic control unit or until said power supply receives an override signal indicating that sensing takes priority over heating.

10. A system according to claim 7, wherein said power supply alternates said electrical current and said voltage signal periodically.

11. A system according to claim 10, wherein said power supply alternates said electrical current and said voltage signal every 10-100 milliseconds.

12. A system according to claim 7, wherein said electrical current and said voltage signal are generated simultaneously and continuously.

13. A system according to claim 6, further comprising a second electronic control unit comprising a second power supply, wherein said first power source generates the electrical current through said heater mat to heat said steering wheel rim and said second power source generates a respective voltage signal through said shield circuit to shield said sensor circuit.

14. A system according to claim 13, wherein said electronic control unit and said second electronic control unit are in electronic communication with each other.

15. A system according to claim 13, wherein said electrical current and said respective voltage signal are generated simultaneously and continuously.

16. A system according to claim 2, wherein said conductive traces define a first pattern on said first face and a second pattern on said second face, and wherein said first pattern and said second pattern comprise respective weft-knit patterns.

17. A system for sensing an occupant within a vehicle, comprising:
a steering wheel comprising a steering wheel rim;
an electronic control unit comprising a processor connected to computerized memory storing software controlling a power supply;
a substrate comprising:
a non-conductive base sheet having a first face and a second face,
respective conductive traces adhered directly onto the first face and the second face, wherein said respective conductive traces are in electronic communication with the electronic control unit and the power supply;
wherein said base sheet and said traces each comprise flexible compositions with a mutual resilience allowing the base sheet and the conductive traces to stretch and contract in conjunction with one another and maintain electrical continuity of the conductive traces in the presence of deforming forces upon the substrate;
a first carbon polymer layer connected to the first face of substrate; and
a second carbon polymer layer connected to the second face of the substrate;
wherein the substrate is wrapped around the steering wheel rim.

18. A system according to claim 17, further comprising a heater mat wrapped around said steering wheel rim, said heater mat comprising conduits in electronic communication with said electronic control unit and said power supply.

19. A system for sensing an occupant within a vehicle, comprising:
a steering wheel comprising a steering wheel rim;
an electronic control unit comprising a processor connected to computerized memory storing software controlling a power supply;
a substrate comprising:
a single non-conductive base layer having a first face and a second face;
respective conductive traces defining respective patterns adhered onto the first face and the second face, said respective conductive traces in electronic communication with the electronic control unit and the power supply;
wherein said patterns define a plurality of redundant electrically conductive pathways across regions of the patterns;
wherein said base layer and said traces each comprise flexible compositions with a mutual resilience allowing the base layer and the conductive traces to stretch and contract in conjunction with one another and maintain electrical continuity of the conductive traces in the presence of deforming forces upon the substrate;
a first carbon polymer layer connected to the first face of substrate; and
a second carbon polymer layer connected to the second face of the substrate,
wherein said carbon polymer layers extend over and between said conductive traces for additional redundancy in electrical conductivity;
wherein the substrate is wrapped around the steering wheel rim.

20. A system according to claim 19, wherein conductive traces on the first face comprises a shield circuit and additional conductive traces on the second face comprises a sensor circuit.

* * * * *